United States Patent
Koren et al.

[11] Patent Number: 5,889,898
[45] Date of Patent: Mar. 30, 1999

[54] CROSSTALK-REDUCED INTEGRATED DIGITAL OPTICAL SWITCH

[75] Inventors: Uziel Koren, Fair Haven; Anat Sneh, Branchburg, both of N.J.; Jane Elisa Zucker, Miami, Fla.

[73] Assignee: Lucent Technologies Inc., Murray Hill, N.J.

[21] Appl. No.: 799,637

[22] Filed: Feb. 10, 1997

[51] Int. Cl.⁶ .................................................. G02B 6/26
[52] U.S. Cl. ................................. 385/9; 385/43; 385/45; 385/16; 385/22; 385/21
[58] Field of Search .................................. 385/1, 2, 3, 4, 385/5, 6, 7, 8, 9, 10, 16, 17, 20, 21, 45, 43, 50, 129, 132

[56] References Cited

U.S. PATENT DOCUMENTS

| 5,400,418 | 3/1995 | Pearson et al. | 385/6 |
| 5,418,868 | 5/1995 | Cohen et al. | 385/16 |
| 5,452,383 | 9/1995 | Takiguchi | 385/16 |

FOREIGN PATENT DOCUMENTS

| 0 380 983 A | 8/1990 | European Pat. Off. |
| 0 568 704 A | 11/1993 | European Pat. Off. |

OTHER PUBLICATIONS

H. Okayama and M. Kawahara, "Reducing of Voltage–Length Product for Y–branch Digtial Optical Switch," Journal of Lightwave Technology, vol. 11, No. 2, pp. 379–187, Feb. 1993.

W.K. Burns, "Shaping the Digital Switch," IEEE Photonics Technology Letters, vol. 4, No. 8, pp. 861–863, Aug. 1992.

M.N. Khan et al., "Design and Demonstration of Weighted–Coupling Digital Y–branch Optical Switches in InGaAs/InGaAlAs Electron Transfer Waveguides,"Journal of Lightwave Technology, vol. 12, No. 11, pp. 2032–2039, Nov. 1994.

K. Padmanabhan and A.N. Netravali, "Diplated Networks for Photonic Switching," IEEE Transactions on Communications, vol. COM–35, No. 12, pp. 1357–1365, Dec. 1987.

(List continued on next page.)

*Primary Examiner*—Hung N. Ngo

[57] ABSTRACT

Methods and apparatus for performing optical signal switching or other optical routing functions in an optical device or system, in which crosstalk induced by modal interference is suppressed by providing appropriate loss, gain and/or refractive index changes in different parts of a switch structure. An exemplary optical signal switch includes first and second branches each having a refraction-controlled section and an absorption-controlled section. An optical signal path over which an optical signal propagates in passing through the switch is selected to include a portion of at least one of the first and second branches, such that one of the first and second branches is a selected branch and the other branch is a non-selected branch. The refraction-controlled section of the selected branch is configured in a high effective refractive index state which allows the optical signal to propagate along at least a portion of the selected branch, while the refraction-controlled section of the non-selected branch is configured in a low effective refractive index state. The absorption-controlled section of the selected branch is configured in a low absorption state, while the absorption-controlled section of the non-selected branch is configured in a high absorption state to reduce crosstalk within the optical switch. An effective refractive index in a given refraction-controlled section may be provided using electro-refractive techniques such as the quantum-confined Stark effect (QCSE) or the Franz-Keldysh effect, or by carrier-induced effects such as carrier injection or carrier depletion. An absorption change in a given absorption-controlled section may be provided using electro-absorptive techniques or a gain-switching technique. The switch may be configured as a Y-branch switch, a directional coupler, or in other suitable configurations, and may be interconnected with other similar switches to construct 1×N, N×1, N×M and N×N switch arrays.

46 Claims, 4 Drawing Sheets

OTHER PUBLICATIONS

A. Sneh, J.E. Zucker and B.I. Miller, "Compact, Low–Crosswalk, and Low–Propagations–Loss Quantum–Well Y–branch Switches," IEEE Photonics Technology Letters, vol. 8, No. 12, pp. 1644–1646, Dec. 1993.

J.E. Zucket et al., "Quaternary Quantum Wells for Electro–Optic Intensisty and Phase Modulation at 1.3 and 1.55 $\mu$m," Applied Physics Letters, vol. 54, pp. 10–12, Jan. 1989.

J.F. Vinchant et al., "InP/GaInAsP Guided–Wave Phase Modulators Based on Carrier–Induced effect: Theory and Experiment," Journal of Lightwave Technology, vol. 10, No. 1, pp. 63–70, Jan. 1992.

W.H. Nelson et al., "Wavelenghts and Polarization–Independent Large Angle InP/InGaAsP Digital Optical Switches With Extinction Ratios Exceeding 20 db," IEEE Photonics Technology Letters, vol. 6, No. 11, pp. 1332–1334, Nov. 1994.

K. Yamada et al., "Low Polarization Dependence (<0.3 db) in an Ea Modulator Using a Polyimide–Buried High–Messa Ridge Structure with an InGaAsP bulk absorption layer," Electronics Letters, vol. 31, No. 3, pp. 237–238, Feb. 1995.

D.J. Robbins, "Franz–Keldysh Effect in GaAsP," pp. 435–437 in Properties of Indium Phosphide, EMIS Datareviews Series No. 6, INSPEC, New York, Sep. 1990.

R.A. Soref and Kam–Yin Lau, "A Proposed Carrier–Induced Electrooptical Switch in III–V Quantum–Well Waveguide," Proceedings of the 21st Eur. Conf. on Opt. Comm. (ECOC '95), Brussels, 1995.

Patent Abstracts of Japan, vol. 014, No. 027 (P–992), Jan. 19, 1990, JP 01 267526 A (Fujitsu Ltd.).

CROSSTALK-REDUCED INTEGRATED DIGITAL OPTICAL SWITCH

FIELD OF THE INVENTION

The present invention relates generally to digital optical switches and more particularly to a digital optical switch which utilizes both refractive index and absorption change effects to control optical switching functions.

BACKGROUND OF THE INVENTION

Optical routing in wavelength-division multiplexing optical systems requires a wavelength and polarization insensitive photonic switching fabric which includes a switch array. The switch array may be implemented in InGaAsP/InP optical devices using digital optical switches or laser-amplifier gate switches. An advantage of the digital optical switch approach is the low wavelength and polarization sensitivity of the digital optical switch. InP-based digital optical switches are typically more compact than those implemented in $LiNbO_3$, and are also more easily integrated with other active devices to form large switch arrays. However, it is very difficult to achieve consistently good polarization-independent crosstalk of about −15 dB or less in a single Y-branch digital optical switch. This difficulty arises from the need to suppress second-order local normal mode excitation along the Y-branch structure. A conventional approach to reducing the local normal mode excitation is to allow for reasonably adiabatic modal evolution by utilizing relatively long devices of about 5 mm or more with small opening angles. Unfortunately, this approach increases propagation and bending losses and therefore leads to excessive switch loss.

Attempts to reduce the switch size and the associated excessive loss in the Y-branch digital optical switch have led to a number of "shaping" designs. Exemplary shaping designs are described in H. Okayama and M. Kawahara, "Reduction of Voltage-Length Product for Y-branch Digital Optical Switch," Journal of Lightwave Technology, Vol. 11, No. 2, pp. 379–387, February, 1993; W. K. Burns, "Shaping the Digital Switch," IEEE Photonics Technology Letters, Vol. 4, No. 8, pp. 861–863, August, 1992; and M. N. Khan et al., "Design and Demonstration of Weighted-Coupling Digital Y-branch Optical Switches in InGaAs/InGaAlAs Electron Transfer Waveguides," Journal of Lightwave Technology, Vol. 12, No. 11, pp. 2032–2039, November, 1994, all of which are incorporated by reference herein. These and other shaping designs often introduce coupling between the first order local normal mode and the second order mode, thereby substantially increasing the polarization and voltage sensitivity of the crosstalk. Moreover, the switch becomes more sensitive to fabrication tolerances and defects which tend to excite the second order mode, thereby further contributing to crosstalk.

As a result, dilated switching techniques are typically employed in applications requiring crosstalk values of about −25 dB or less. Dilating generally involves adding one or more additional switch stages to a given switch to further isolate the crosstalk. Exemplary dilated switching techniques are described in K. Padmanabhan and A. N. Netravali, "Dilated Networks for Photonic Switching," IEEE Transactions on Communications, Vol. COM-35, No. 12, pp. 1357–1365, December, 1987, which is incorporated by reference herein. However, additional switch stages not only increase the overall switch loss but also substantially increase the size of the switch array. Moreover, dilated switch arrays require more complex electronic control than comparable non-dilated switch arrays, in that the decision as to which switch elements of the dilated switching stage should be turned on or off depends on the specific signal path through the switch array.

The above-noted laser-amplifier gate switch approach provides inherently better crosstalk than the digital optical switch approach, typically on the order of −30 dB or less. However, the laser-amplifier gate switch approach leads to an accumulation of amplified spontaneous emission (ASE) noise in the switch array which can contribute to crosstalk. In addition, it is very difficult to achieve uniform performance and low polarization dependent loss (PDL) and crosstalk across a given chip and within the switch array. Moreover, the amplifier performance can be affected by the residual reflectivity at the interface between the active and passive regions, and the uniformity of that interface across the chip. These and other factors make the laser-amplifier gate switch approach difficult to implement in many practical optical switching applications. It would therefore be desirable to improve the crosstalk performance of the digital optical switch approach in a manner which avoids the problems associated with the conventional dilation or shaping approaches.

As is apparent from the above, a need exists for an improved digital optical switch which exhibits reduced crosstalk and can be implemented without the use of dilation or any other significant increase in switch size or switch array control complexity.

SUMMARY OF THE INVENTION

The present invention provides an integrated digital optical switch suitable for performing optical signal processing functions in an optical system. Crosstalk induced by modal interference is suppressed in the switch by providing appropriate loss, gain and/or refractive index changes in different parts of the switch structure. The optical switch of the present invention in a preferred embodiment utilizes switch branches having both refraction-controlled and absorption-controlled sections. The refraction-controlled sections are configured to provide either a high effective refractive index allowing an optical signal to propagate along the branch, or a low effective refractive index which tends to attenuate the optical signal. The absorption-controlled sections are configured to provide either a low absorption level which allows an optical signal to propagate through the branch, or a high absorption level which attenuates the optical signal to reduce crosstalk. The refraction-controlled and absorption-controlled sections of the switch are implemented such that a substantial reduction in crosstalk is achieved without significantly increasing the size of the switch, the switch insertion loss or the control complexity of a switch array constructed from these switches.

The refractive index changes in the refraction-controlled sections may be provided using electro-refraction techniques such as the quantum confined Stark effect (QCSE) in quantum-well material and the Franz-Keldysh effect in bulk material, as well as other techniques such as carrier-induced effects. The absorption changes in the absorption-controlled sections may be provided using electro-absorptive techniques such as QCSE or Franz-Keldysh effect, as well as other techniques such as gain switching. The electro-refractive and electro-absorptive techniques generally involve reverse biasing a diode structure corresponding to a given refraction-controlled or absorption-controlled section. Refraction control by carrier-induced effects may involve injecting carriers into a forward-biased diode structure associated with a given refraction-controlled section, or depleting carriers from a reverse-biased diode structure associated with the given section. Absorption control by gain switching may involve inducing gain in a given absorption-controlled section by injecting current into a forward-biased diode structure associated with the given section, where the given section may have substantial propagation loss without the injected current.

In accordance with one aspect of the invention, a Y-branch switch is provided which includes a coupler section and first and second branches which receive optical signal power from or deliver optical signal power to the coupler section. The branches may be formed as waveguides each having a first section adjacent the coupler section and associated with a region of refraction-controlled material formed on a substrate, and a second section associated with a region of absorption-controlled material formed on the substrate. The refraction-controlled and absorption-controlled sections as well as other sections of the switch may be configured to form positive-intrinsic-negative (p-i-n) diode structures using InGaAsP/InP, InGaAs/InAlAs, AlGaAs/GaAs or other suitable quantum-well or bulk semiconductor materials.

The refraction-controlled sections of the branches operate in conjunction with the underlying refraction-controlled material to provide refractive index changes which configure the switch to provide desired optical signal routing. The absorption-controlled sections of the branches operate in conjunction with the underlying absorption-controlled material to reduce crosstalk by introducing absorption in a non-selected branch of the switch, or to block signal output completely by introducing absorption in both branches. For example, if the first branch of the switch is switched into an "on" state in order to pass an optical signal with low propagation loss, an absorption-controlled section of the non-selected second branch is also switched into a high absorption "on" state to provide an increased absorption which tends to reduce crosstalk.

The exemplary 1×2 Y-branch refraction-controlled and absorption-controlled switch may be used as a building block in constructing larger 1×N, N×1, N×M and N×N switch arrays. For example, four of the above-described Y-branch switches may be interconnected to form a 2×2 strictly non-blocking switch, and multiple 2×2 strictly non-blocking switches may be interconnected to construct larger N×N strictly non-blocking switch arrays with routing, broadcasting and no-connect functions.

In accordance with another aspect of the invention, a 2×2 digital optical switch configured as a directional coupler is provided. The 2×2 switch includes a first branch and a second branch, each having a first absorption-controlled section, a refraction-controlled section and a second absorption-controlled section. In one mode of operation, optical signal power may be coupled from the first branch to the second branch by placing the refraction-controlled section of the first branch into an "off" state, and placing the refraction-controlled section of the second branch into an "on" state. An absorption-controlled section in the first non-selected branch is placed into a high absorption "on" state to reduce crosstalk, while the other absorption-controlled section remains in a low absorption "off" state. Like the 1×2 Y-branch switch, this exemplary 2×2 refraction-controlled and absorption-controlled digital optical switch may also be used as a building block in constructing larger N×N strictly non-blocking switch arrays as well as other types of switch arrays.

The digital optical switches of the present invention provide reduced crosstalk without significantly increasing the switch size, insertion loss or the complexity of switch array control. The present invention thus overcomes the problems associated with the above-described shaping and dilation techniques, thereby providing improved performance in wavelength division multiplexed optical systems as well as other optical signal processing applications. These and other features and advantages of the present invention will become more apparent from the accompanying drawings and the following detailed description.

DETAILED DESCRIPTION OF THE INVENTION

The present invention will be illustrated below in conjunction with an exemplary InGaAsP/InP-based digital optical Y-branch switch. It should be understood, however, that the invention is not limited to use with any particular type of material or optical switch configuration, but is instead more generally applicable to any optical switch or other optical signal routing device in which it is desirable to achieve reduced crosstalk without a significant increase in device size, insertion loss or switching complexity. The term "digital optical switch" as used herein is therefore intended to include not only 1×2 Y-branch optical switches but also other types of non-dilated or dilated optical switching and routing devices, including 2×2 directional couplers. The terms "on" and "off" in the context of the switching states of a refraction-controlled section refer to states in which an optical signal experiences relatively high effective refractive index and relatively low effective refractive index, respectively, within that section. The terms "on" and "off" in the context of the switching states of an absorption-controlled section refer to states in which an optical signal experiences relatively high absorption and relatively low absorption, respectively, within that section. The terms "refraction-controlled section" and "absorption-controlled section" are used herein to refer to the corresponding portions of a given branch of a digital optical switch, which operate in conjunction with an underlying refraction-controlled material or absorption-controlled material, respectively, to provide the switching and crosstalk reduction functions described herein. The term "refraction-controlled" as used herein should be understood to include not only materials or structures operating in accordance with electro-refractive effects such as the quantum-confined Stark effect (QCSE) or the Franz-Keldysh effect, but also materials or structures operating in accordance with other techniques such as carrier-induced effects to produce a desired change in refractive index. The term "absorption-controlled" as used herein should be understood to include not only materials or structures operating in accordance with conventional electro-absorptive effects such as QCSE or Franz-Keldysh effect, but also materials or structures operating in accordance with other techniques such as gain switching to produce a desired absorption change. The terms "selected" or "non-selected" in the context of switch branches refer to switch branches in which a refraction-controlled section is placed in an "on" state or an "off" state, respectively. It should be noted that a particular switch may be configured such that an optical signal propagates along a portion of a non-selected branch before being directed into a selected branch.

Figure 1:
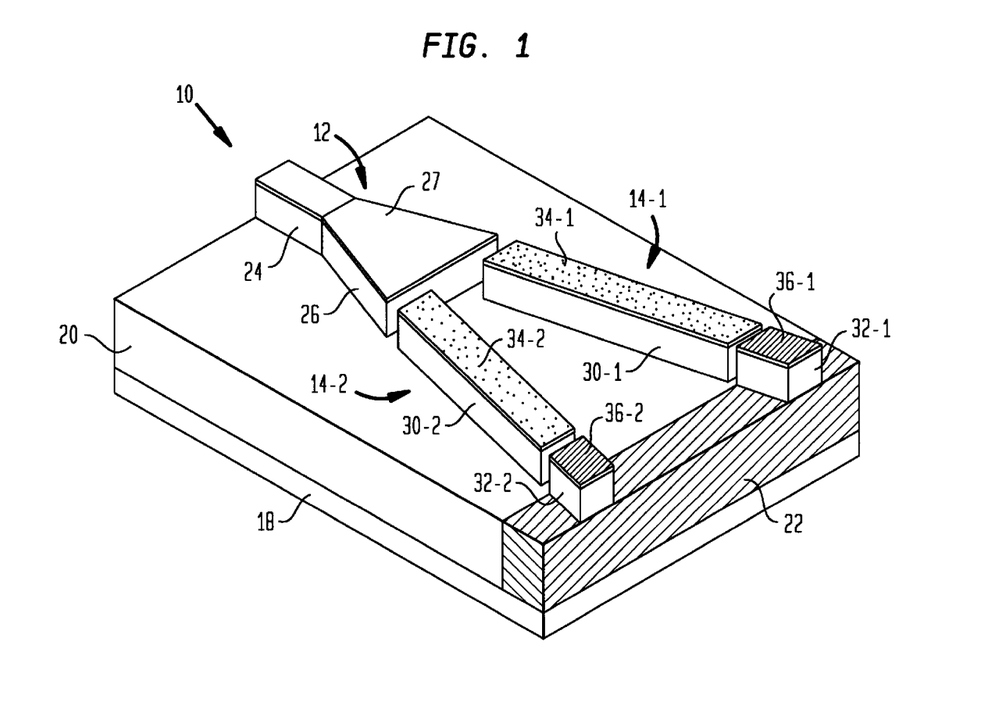
FIG. 1 shows an exemplary refraction-controlled and absorption-controlled integrated digital optical switch in accordance with the present invention.

FIG. 1 shows an exemplary digital optical switch 10 in accordance with the present invention. The optical switch 10 includes a waveguide coupler 12, a first branch 14-1 and a second branch 14-2. The switch 10 is formed on a substrate 18 which may be an n+InP substrate. A region 20 of refraction-controlled material is formed on the substrate 18, and may include as a core a multiple quantum-well (MQW) structure having about twenty InGaAsP/InP quantum wells. In alternative embodiments, the region 20 may be formed of bulk semiconductor material rather than quantum-well material. The region 20 underlies the coupler 12 and a first section of each of the branches 14-1 and 14-2. A region 22 of absorption-controlled material is formed on the substrate 18 at an output end of the switch 10 underlying a second section of each of the branches 14-1 and 14-2. The waveguide coupler 12 includes an input section 24 of straight waveguide which may be about 2.2 $\mu$m wide by about 100 $\mu$m long, followed by a triangular waveguide taper section 26 which may be about 250 $\mu$m long. An upper layer 27 of the coupler 12 may be a layer of p+InGaAs material about 1000 Å thick. The triangular taper section 26 is used to shape the switch 10 using a two-angle weighted coupling technique such as that described in the above-cited H. Okayama and M. Kawahara reference. It should be noted that the dimensions of the various elements of FIG. 1 are not drawn to scale.

The branches 14-1 and 14-2 are arranged at an opening angle and separated by an initial branch separation at an input end near the output of the triangular taper section 26. The opening angle of the branches may be on the order of 0.1° and the initial branch separation at the input end may be about 1 $\mu$m. The branches 14-1 and 14-2 include respective first or refraction-controlled sections 30-1 and 30-2 and respective second or absorption-controlled sections 32-1 and 32-2. The first sections 30-1 and 30-2 are arranged to overlay the refraction-controlled material region 20, and the second sections 32-1 and 32-1 are arranged to overlay the absorption-controlled material region 22.

The sections 30-1, 30-2, 32-1 and 32-2 may be formed of p-type InP material and may have a width of about 2.2 $\mu$m and a thickness of about 1.0 $\mu$m. The sections 30-1 and 30-2 represent p-type InP upper cladding layers which operate in accordance with core refraction-controlled region 20 and substrate 18 to provide refractive index changes along respective branches 14-1 and 14-2. The sections 32-1 and 32-2 represent p-type InP upper cladding layers which operate in accordance with the core absorption-controlled region 22 and the substrate 18 to provide absorption changes along respective branches 14-1 and 14-2 to reduce crosstalk in accordance with the invention. The substrate 18 thus serves as a lower cladding layer in the waveguide structures of the switch 10. The first sections 30-1 and 30-2 may be about 1 to 1.5 mm in length, while the second sections 32-1 and 32-2 may be about 200 to 1000 $\mu$m in length. The first sections 30-1 and 30-2 include respective upper layers 34-1 and 34-2 which may be formed of a p+InGaAs material about 1000 Å thick covered by a metallization layer about 1 $\mu$m thick. The second sections 32-1 and 32-2 include respective upper layers 36-1 and 36-2 which may also be formed of a p+InGaAs material about 1000 Å thick covered by a metallization layer about 1 $\mu$m thick. Although illustrated as using ridge-type waveguide structures overlaying the regions 20 and 22, the branches 14-1 and 14-2 may utilize other types of waveguide structures, including buried structures such as symmetric, non-symmetric and partially-buried structures, which are fully or partially contained within the regions 20, 22.

Additional details regarding certain elements of the switch 10 may be found in A. Sneh, J. E. Zucker and B. I. Miller, "Compact, Low-Crosstalk, and Low-Propagation-Loss Quantum-Well Y-Branch Switches," IEEE Photonics Technology Letters, Vol. 8, No. 12, pp. 1644–1646, December 1996, which is incorporated by reference herein. It should be noted that the above-noted materials and dimensions are exemplary only. For example, the InGaAsP/InP materials are particularly well-suited for use with operating wavelengths around 1300 nm or 1500 nm. Alternative embodiments may provide refraction control and absorption control functions using other materials including InGaAs/InAlAs, which is particularly well-suited for operating wavelengths around 1500 nm, or AlGaAs/GaAs, which is particularly well-suited for operating wavelengths of about 850 nm. In addition, the device dimensions will generally vary depending upon operating wavelength and other application-specific factors.

In a signal routing mode of operation, the switch 10 may be used to route an optical signal applied to the input section 24 of coupler 12 to an output of a selected one of the branches 14-1 and 14-2. A selected branch of the switch 10 is placed into an "on" state by providing appropriate refractive index changes in one or more of the branches. A branch placed in an "on" state will typically have a higher effective refractive index than a branch in an "off" state. The optical signal applied to the input section 24 will then propagate down the selected branch with relatively low loss and higher effective refractive index than the other branch. The non-selected branch of the switch 10 may be placed into an "off" state by the refractive index change discussed above, in conjunction with an absorption change which greatly attenuates the optical signal in the non-selected branch. The switch 10 may also operate in a broadcasting mode, in which the optical signal applied to the input section 24 of coupler 12 is supplied with a relatively low propagation loss to outputs of both branches 14-1 and 14-2, or a no-connection mode, in which high absorption is provided in both branches such that the input optical signal is not supplied to either branch output.

The refractive index change may be provided in the first section 30-1 or 30-2 of branch 14-1 or 14-2 using electro-refraction effects such as the quantum-confined Stark Effect (QCSE) in quantum-well materials or the Franz-Keldysh effect for bulk materials, or carrier-induced effects such as carrier injection or carrier depletion. In an embodiment utilizing electro-refraction effects such as QCSE or Franz-Keldysh effect, branch 14-1 of switch 10 is placed in a high effective refractive index "on" state by reverse biasing the p-i-n structure formed by the p-type InP first section 30-1 of branch 14-1, the refraction-controlled material of region 20 and the substrate 18, while the branch 14-2 remains unbiased and therefore in a low effective refractive index "off" state. The reverse biasing of the p-i-n diode structure generally produces a positive refractive index change for operating wavelengths sufficiently below the material bandgap, although it should be noted that QCSE tends to produce a more pronounced refractive index change than the Franz-Keldysh effect. These and other aspects of refractive index change by QCSE and Franz-Keldysh effect are described in greater detail in, for example, J. E. Zucker et al., "Quaternary Quantum Wells for Electro-Optic Intensity and Phase Modulation at 1.3 and 1.55 $\mu$m," Applied Physics Letters, Vol. 54, pp. 10–12, January, 1989, which is incorporated by reference herein.

In an embodiment in which refractive index change is provided using carrier-induced effects, branch 14-1 of switch 10 may be placed in an on state by injecting current into a forward biased p-i-n diode structure formed by first section 30-2 of branch 14-2, region 20 and substrate 18, while not injecting current into the corresponding p-i-n diode structure formed by first section 30-1 of branch 14-1, region 20 and substrate 18. In this case, the resulting refractive index change is generally negative when operating below the material bandgap. Alternatively, refractive index change by carrier-induced effects may be provided by carrier depletion from an n-type material with reverse biasing of the corresponding p-i-n diode structure, in which case the resulting refractive index change is generally positive. In such an embodiment, the branch 14-1 is placed in an on state by reverse biasing the p-i-n diode structure formed by section 30-1, region 20 and substrate 18. Refractive index change by carrier-induced effects is described in greater detail in, for example, J. F. Vinchant et al., "InP/GaInAsP Guided-Wave Phase Modulators Based on Carrier-Induced Effects: Theory and Experiment," Journal of Lightwave Technology, Vol. 10, No. 1, pp.63–70, January, 1992, and W. H. Nelson et al., "Wavelength and Polarization-Independent Large Angle InP/InGaAsP Digital Optical Switches With Extinction Ratios Exceeding 20 dB," IEEE Photonics Technology Letters, Vol. 6, No. 11, pp. 1332–1334, November, 1994, both of which are incorporated by reference herein.

The present invention provides improved crosstalk in the exemplary Y-branch digital optical switch 10 in part by introducing absorption into the branches 14-1 and 14-2 using second sections 32-1 and 32-2 of the branches 14-1 and 14-2 in conjunction with absorption-controlled region 22. For example, in an embodiment in which absorption control is provided using electro-absorptive effects, crosstalk may be improved in a routing mode of operation in which branch 14-1 is in an on state and branch 14-2 is in an off state by reverse biasing the p-i-n structure formed by the second section 32-2 of branch 14-2 in conjunction with the absorption-controlled material region 22 and the substrate 18. This will provide increased absorption in the non-selected or "off" branch 14-2 in order to suppress first order optical signal power in that branch as well as to suppress any residual second-order optical power trapped in that branch. The absorption-controlled material of region 22 may be an InGaAsP material, an InGaAs material, an AlGaAs material or other suitable semiconductor quantum-well or bulk material. The absorptive characteristics of InGaAsP are described in greater detail in, for example, K. Yamada et al., "Low Polarization Dependence (<0.3 dB) in an EA Modulator Using a Polyimide-Buried High-Mesa Ridge Structure with an InGaAsP bulk absorption layer," Electronics Letters, Vol. 31, No. 3, pp. 237–238, February, 1995, and D. J. Robbins, "Franz-Keldysh Effect in InGaAsP," pp. 435–437 in "Properties of Indium Phosphide, EMIS Datareview Series No. 6, INSPEC, New York, September, 1990, both of which are incorporated by reference herein.

The absorption change in the absorption-controlled sections 32-1 and 32-2 of switch 10 may be provided using electro-absorptive effects or gain switching. The electro-absorptive effects are generally provided in a manner similar to that described above for the electro-refractive refraction-controlled effects, except that the material bandgap may be selected as closer to the operating wavelength as described in the above-cited Yamada et al. reference. In an embodiment in which absorption control is provided using an electro-absorptive technique and reverse biasing of a p-i-n diode, the resulting absorption change is generally positive. In embodiments which utilize gain switching, the absorption-controlled section generally exhibits a high absorption without the application of bias, and a negative absorption change is provided by injecting current into a forward biased p-i-n diode structure. The material selection and diode design is similar to that used in laser diode or laser amplifier applications. Since a large gain to overcome splitting losses is typically not required in the illustrative embodiment of FIG. 1, the desired absorption change can be provided in gain switching embodiments using a relatively short absorption-controlled material section and a small injected current. Embodiments of the invention utilizing gain switching to provide absorption control thus configure a given absorption-controlled section in a high-absorption off state without the application of bias, and in an on state by injecting current into the forward-biased diode structure such that a gain is induced in the section to overcome the absorption loss. The amount of induced gain may be selected as sufficient to offset just the absorption loss, such that the section becomes effectively transparent at the operating wavelength, or to provide a slight additional gain such that other signal path losses are also offset.

Regardless of the manner in which the absorption change is provided within the switch 10 of FIG. 1, the absorption-controlled material of region 22 should be selected such that the additional propagation loss in the off state of the second sections 32-1 and 32-2 is relatively low, preferably less than or equal to about 2 dB, while the absorption change $\Delta\alpha$ from the off to the on state yields a suppression ratio preferably greater than or equal to 15 dB. Of course, other selection criteria for the absorption-controlled material may be used in a given application.

Figure 2:
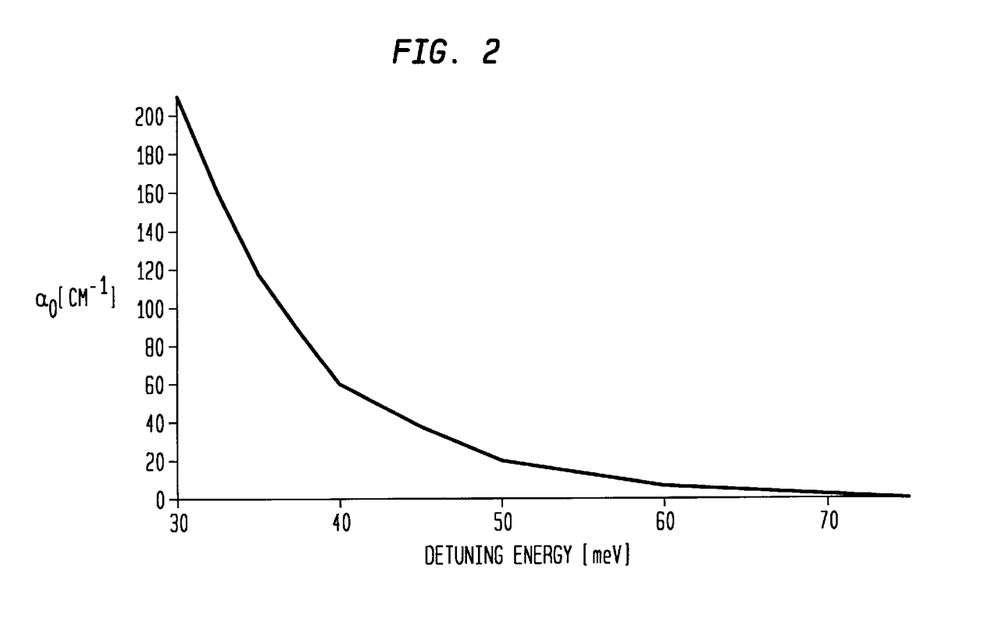
FIG. 2 is a plot of the absorption coefficient $\alpha_0$ of an InGaAsP lattice matched to InP as a function of detuning energy.

The following example illustrates an implementation of the switch 10 in which absorption control is provided in sections 32-1 and 32-2 by using an electro-absorptive technique and thus an electro-absorptive material in region 22. FIG. 2 is a plot of the absorption coefficient values $\alpha_0$ in cm$^{-1}$ of an exemplary InGaAsP electro-absorptive material lattice matched to InP as a function of detuning energy in meV. The plot is based on an $\alpha_0$ value of about 45 cm$^{-1}$ at a detuning energy of about 43.5 meV. The above-cited K. Yamada et al. reference indicates that the InGaAsP material exhibits a zero-voltage passive loss $L_p$ of about 2 dB/100 $\mu$m for a wavelength $\lambda_{pl}$ of 1.46 $\mu$m and an operating wavelength of about 1.55 $\mu$m which corresponds to a detuning energy of about 43.5 meV. The coefficient values $\alpha_0$ shown in FIG. 2 are extrapolations for other detuning energy values based on measured results for both InP and InGaAs as given in the above-cited D. J. Robbins reference. The passive loss $L_p$ in the InGaAsP electro-absorptive material is given by:

$$L_p = 4.434 \Gamma \alpha_0 L$$

where $\Gamma$ is the mode confinement factor and L is the length of the electro-absorptive material region 22. The extrapolated dependence of the absorption coefficient values $\alpha_0$ on the detuning energy DE may be expressed as:

$$\alpha_0 \sim \exp\left(\frac{-DE}{8.4 \text{ meV}}\right).$$

This expression was obtained by curve fitting to the measured results given in the above-cited D. J. Robbins reference, and is plotted in FIG. 2. It can be seen from FIG. 2 that the absorption change $\Delta\alpha$ is lowest at the largest detuning energy, which generally corresponds to the longest wavelength in the operating wavelength range of the electro-absorptive material. The propagation loss due to $\alpha_0$ is largest at the smallest detuning energy, which generally corresponds to the shortest wavelength in the operating wavelength range. A detuning energy range from about 65 to 70 meV, corresponding to a wavelength range of approximately 30 nm centered at about 1550 nm, can be expected to yield an absorption change $\Delta\alpha$ which is about four times smaller at 75 meV detuning than at 43.5 meV detuning. The absorption change at 43.5 meV detuning is about 250 cm$^{-1}$ for a $\Gamma$ value of about 1. At 43.5 meV detuning, an absorption-controlled device length of about 200 $\mu$m provides about 20 to 25 dB of optical signal level modulation for an electric field of about 10 V/$\mu$m. An absorption-controlled device length of about 800 $\mu$m would therefore be needed to provide 20 to 25 dB of optical signal attenuation in the second sections 32-1 and 32-2 of the respective branches 14-1 and 14-2 of switch 10. Such an absorption-controlled device would be expected to have a worst case passive loss $L_p$ of about 2.5 dB at a 60 meV detuning, based on the absorption coefficient values of FIG. 2.

Figure 3:
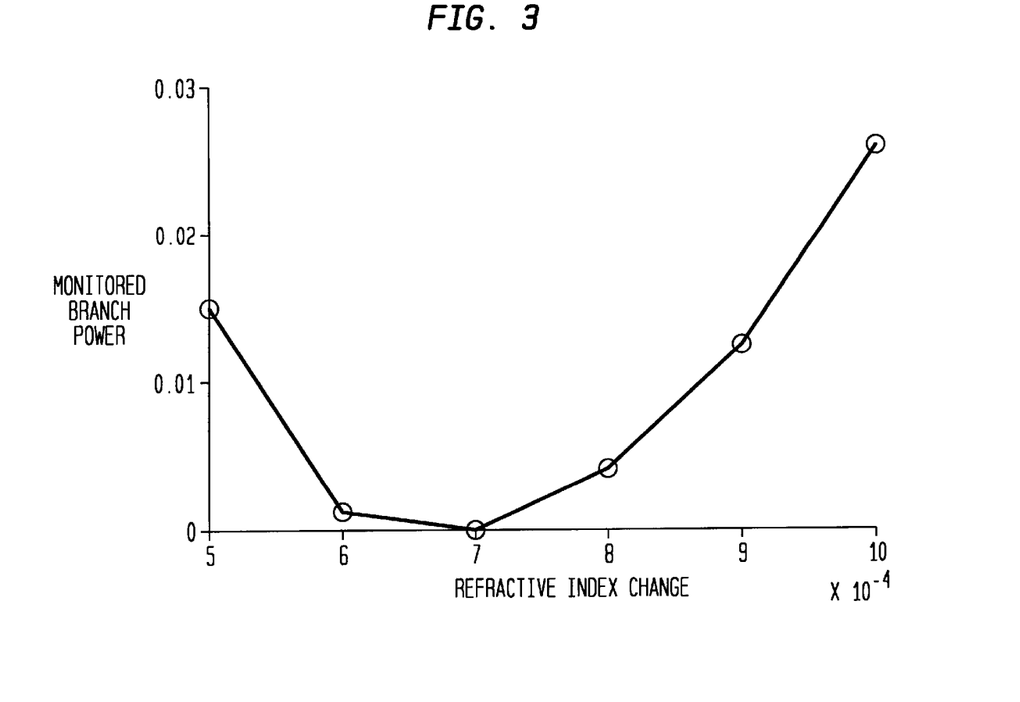
FIGS. 3 and 4 are plots of optical power in branches of a digital optical Y-branch switch illustrating crosstalk as a function of induced change in refractive index.
Figure 4:
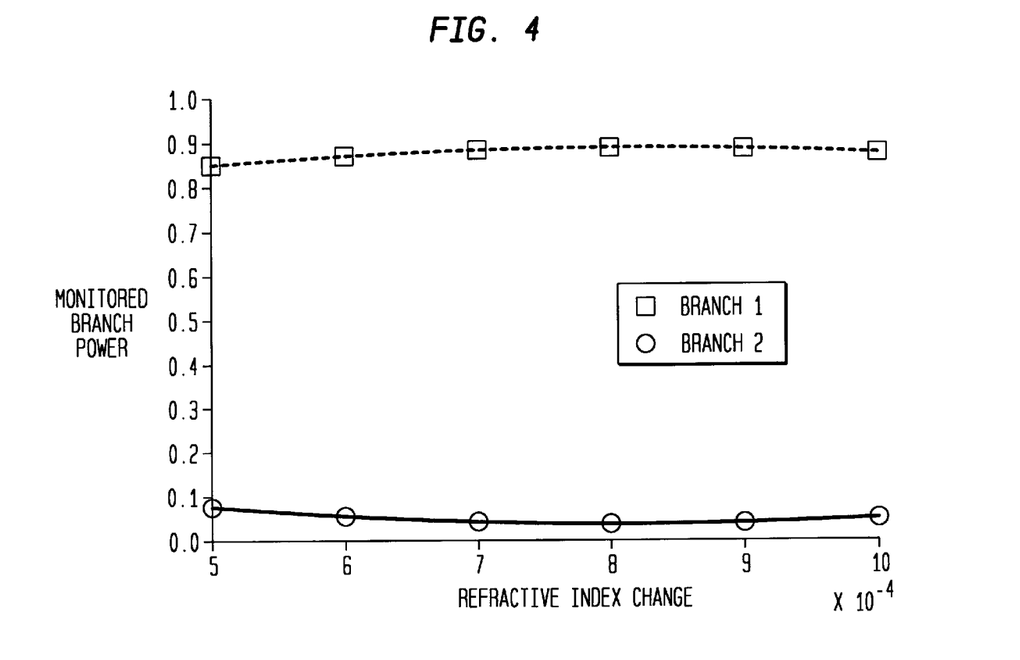

FIGS. 3 and 4 are plots comparing crosstalk as a function of induced refractive index change for Y-branch digital optical switches having different lengths. The Y-branch switch was assumed to include only a refraction-controlled material region 20 and first sections of the branches 14-1 and 14-2, without any of the absorption-controlled features described above. The switch was assumed to be configured with two-angle weighted coupling shaping, and the branches 14-1 and 14-2 were assumed to have an opening angle of about 0.12° and an initial spacing of about 1.3 $\mu$m. The refractive index difference between the core of the refraction-controlled region 20 and the InP cladding of the first sections 30-1 and 30-2 of the respective branches 14-1 and 14-2 was assumed to be about 0.01. FIG. 3 shows the crosstalk dependence in terms of optical signal power monitored at the output of the second branch 14-2 of a 3 mm long Y-branch switch as a function of the refractive index change induced in the first branch 14-1 of the switch. It can be seen from FIG. 3 that a large variation in crosstalk is obtained over the range of induced refractive index changes, indicating that the 3 mm long Y-branch switch without the above-described absorption control features exhibits an excessive polarization sensitivity and low device fabrication tolerance.

FIG. 4 plots the monitored output optical power in first and second branches of a 1500 $\mu$m long Y-branch digital optical switch having the same design as the Y-branch switch described in conjunction with FIG. 3, and thus none of the absorption control features of the present invention. The optical power in the first and second branches is plotted as a function of induced refractive index change in the first branch. It can be seen from FIG. 4 that the optical power in the first branch is relatively constant, and a crosstalk of at least −10 dB is obtained across the entire range of refractive index changes.

Absorption-controlled sections may be added to the above-described 1500 $\mu$m Y-branch switch characterized in the plot of FIG. 4 to improve the crosstalk in accordance with the present invention. For example, the above-described absorption-controlled sections including the second sections 32-1 and 32-2 of the respective first and second branches and the underlying absorption-controlled material region 22 may be added to the switch. This additional absorption-controlled portion of the switch 10 may be selected to have a length on the order of about 800 $\mu$m, such that the total switch length is increased by 800 $\mu$m to 2.3 mm. Although the additional propagation loss attributed to the absorption-controlled section is about 2.5 dB, such a switch configuration provides a number of advantages over conventional crosstalk reduction techniques such as switch dilation. For example, if instead of adding the absorption-controlled section in accordance with the present invention, another switch stage were added to dilate the basic Y-branch switch, the additional loss attributable to the extra stage would include about 1 dB excess Y-junction loss, plus 0.5 dB bend loss, plus about 2 dB/cm times the switch length of 3 mm, for a total additional loss of about 2.1 dB. However, the length of the dilated switch would be about 2 times the switch length of 3 mm, plus about 1 mm of bends, for a total device length of about 7 mm. It should be noted that a shorter device such as the above-described 1.5 mm length switch would generally not provide adequate polarization insensitivity and crosstalk in a two-switch dilated configuration. The dilation approach thus substantially increases the device length relative to a reduced-crosstalk switch configured with an absorption-controlled section in accordance with the invention. Moreover, the absorption-controlled approach of the present invention avoids the complex electronic control associated with configuring a switch array composed of dilated switches. The relative switching states of the absorption-controlled and refraction-controlled sections of a digital optical switch in accordance with the present invention are generally independent of the path through the switch array, and therefore certain switch array control lines can be permanently shorted together in advance. This provides a considerable reduction in switch array control complexity relative to dilated switch arrays.

A refraction-controlled and absorption-controlled digital optical switch in accordance with the invention may serve as a basic building block in a larger switch array. For example, the 1×2 Y-branch digital optical switch 10 of FIG. 1 may be used to construct 1×N, N×1, N×M and N×N switch arrays, where M≠N. Moreover, N×N strictly non-blocking switch arrays can be constructed by using N 1×N arrays as inputs and N N×1 arrays as outputs. It should also be noted that a digital optical switch in accordance with the invention may be implemented in 1×2 or 2×2 structures other than the basic Y-branch structure shown in FIG. 1. An alternative 2×2 structure for a refraction-controlled and absorption-controlled digital optical switch in accordance with the invention will be described in conjunction with FIG. 7 below.

Figure 5A:
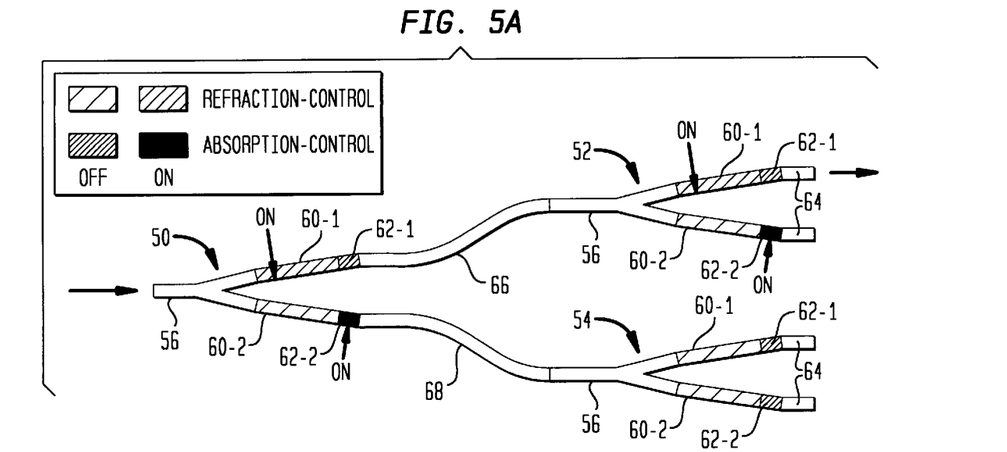
FIGS. 5A–5C illustrate the operation of an exemplary 1×4 optical switch formed using digital optical Y-branch switches configured in accordance with the invention.
Figure 5B:
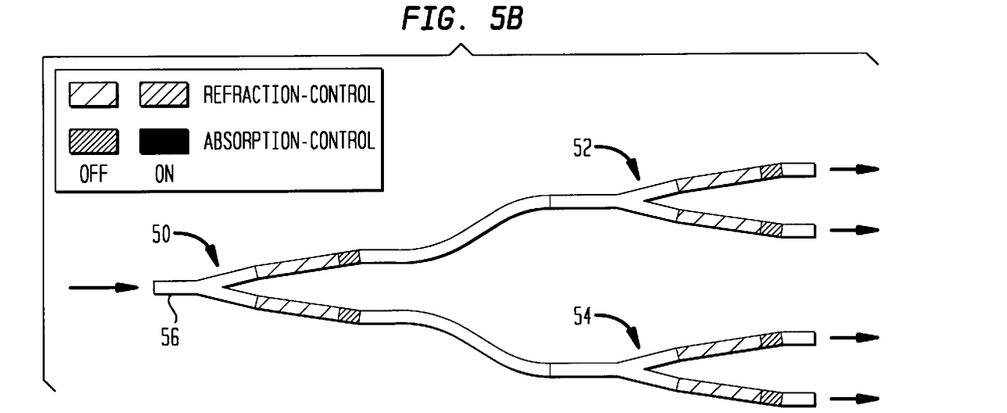
Figure 5C:
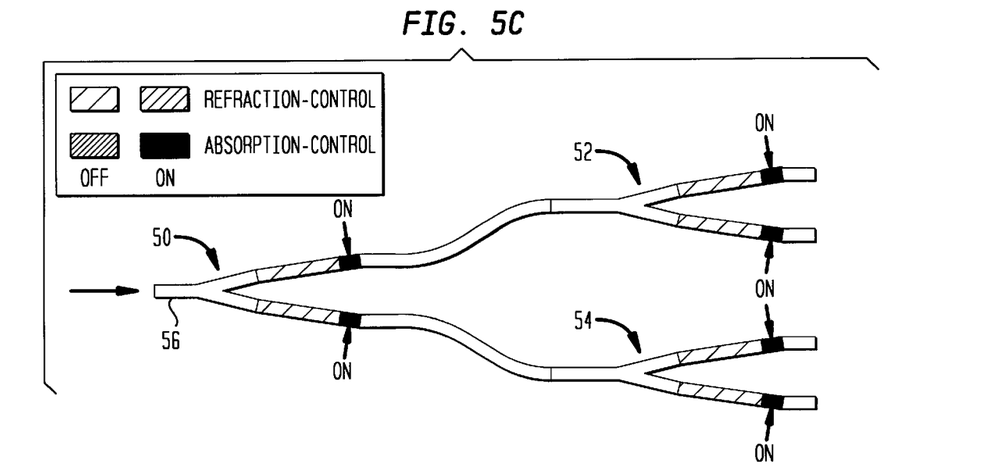

FIGS. 5A–5C illustrate the operation of an exemplary 1×4 optical switch formed using interconnected Y-branch switches in accordance with the invention. FIG. 5A shows a 1×4 optical switch including first, second and third Y-branch switches 50, 52 and 54. Each of the Y-branch switches includes first and second branches associated with an input 56. The first or upper branch of each switch includes a refraction-controlled section 60-1 and an absorption-controlled section 62-1, while the corresponding second or lower branch includes a refraction-controlled section 60-2 and an absorption-controlled section 62-2. The output of the first branch of the switch 50 is coupled to input 56 of switch 52 via waveguide bend section 66, while the output of the second branch of the switch 50 is coupled to input 56 of switch 54 via waveguide bend section 68. The 1×4 switch of FIG. 5A is configured in a routing mode of operation, such that an input optical signal applied to input 56 of switch 50 is routed to the output of the first branch of the switch 52 as indicated by the solid horizontal arrows. To provide this exemplary routing, the refraction-controlled sections 60-1 of switches 50 and 52 are placed in an on state, while all other refraction-controlled sections 60-1 and 60-2 remain in an off state. The crosstalk is reduced by placing the absorption-controlled sections 62-2 of the non-selected second branches of switches 50 and 52 in an on state, while all other absorption-controlled sections remain in an off state. This configuration of additional absorption in the non-selected branches of the 1×4 switch results in substantially improved crosstalk without unduly increasing the size or switching complexity. The crosstalk can be even further improved by placing the absorption-controlled sections 62-1 and 62-2 of switch 54 in an on state.

FIG. 5B shows the 1×4 switch of FIG. 5A configured in a broadcast mode of operation, in which an input optical signal applied to input section 56 of switch 50 is broadcast to all four outputs of the 1×4 switch as indicated by the solid horizontal arrows. In this mode of operation, all refraction-controlled and absorption-controlled sections of the 1×4 switch are placed in an off state. FIG. 5C shows the 1×4 switch of FIG. 5A configured in a no-connection mode of operation, in which an input optical signal applied to input section 56 of switch 50 is not supplied to any output of the 1×4 switch. In this mode of operation, all refraction-controlled sections are placed in an off state while all absorption-controlled sections are placed in an on state in order to limit the crosstalk.

Figure 6:
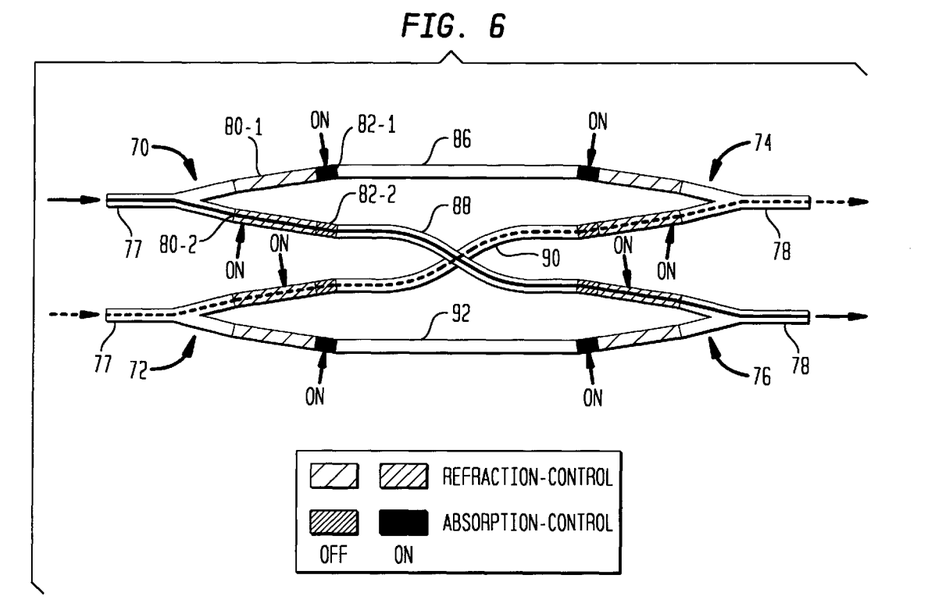
FIG. 6 shows an exemplary 2×2 optical switch formed using digital optical Y-branch switches configured in accordance with the invention.

FIG. 6 shows an exemplary strictly non-blocking 2×2 optical switch formed using four exemplary 1×2 Y-branch digital optical switches configured in accordance with the invention. The strictly non-blocking 2×2 switch of FIG. 6 includes first, second, third and fourth Y-branch switches 70, 72, 74 and 76, each having a first or upper branch with a refraction-controlled section 80-1 and an absorption-controlled section 82-1, and a second or lower branch with a refraction-controlled section 80-2 and an absorption-controlled section 82-2. The first and second switches 70, 72 have input sections 77, while the third and fourth switches 74, 76 have output sections 78. The first branch of the switch 70 is coupled to the first branch of switch 74 via waveguide section 86, the second branch of switch 70 is coupled to the first branch of switch 76 via waveguide bend section 88, the first branch of switch 72 is coupled to the second branch of switch 74 via waveguide bend section 90, and the second branch of switch 72 is coupled to the second branch of switch 76 via waveguide section 92.

The strictly non-blocking 2×2 switch of FIG. 6 is shown configured in a routing mode of operation in which an input optical signal applied to input section 77 of switch 70 is propagated to output section 78 of switch 76 as indicated by the solid horizontal arrows, and an input signal applied to input section 77 of switch 72 is propagated to output section 78 of switch 74 as indicated by the dashed arrows. This routing mode is provided by placing the second branch refraction-controlled sections 80-2 of switches 70 and 74 in an on state, and placing the first branch refraction-controlled sections 80-1 of switches 72 and 76 in an on state, while the other refraction-controlled sections 80-1 and 80-2 of the non-selected branches are placed in an off state. The crosstalk is reduced in accordance with the invention by placing the first branch absorption-controlled sections 82-1 of switches 70 and 74 in an on state, and placing the second branch absorption-controlled sections 82-2 of switches 72 and 76 in an on state, while all other absorption-controlled sections 82-1 and 82-2 remain in an off state. The absorption-controlled sections of the non-selected branches of the 2×2 switch are thus placed into a high absorption on state in order to reduce the crosstalk in these branches.

Figure 7:
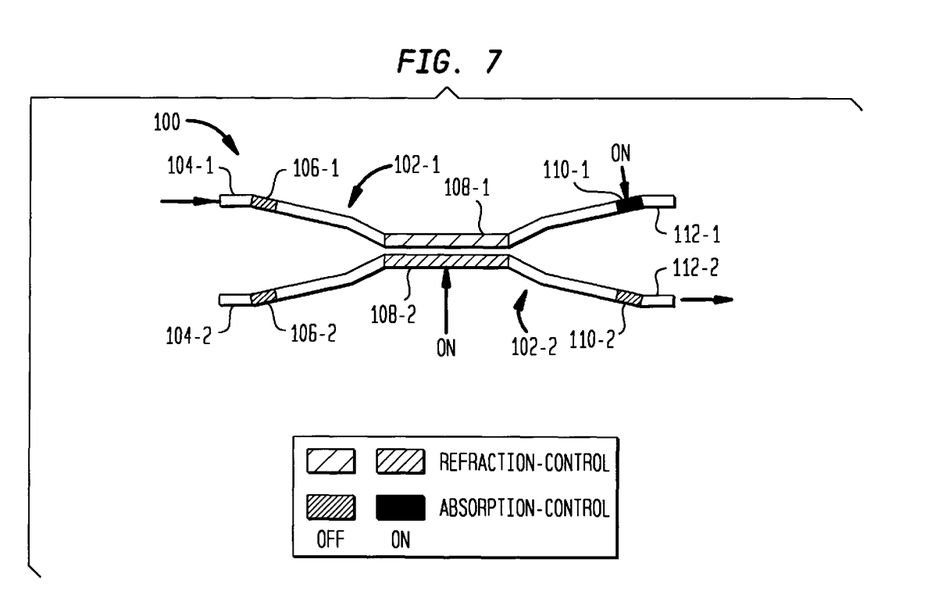
FIG. 7 shows another exemplary refraction-controlled and absorption-controlled integrated digital optical switch implemented as a directional coupler in accordance with the invention.

FIG. 7 shows an exemplary 2×2 digital optical switch 100 configured as a directional coupler in accordance with the present invention. The switch 100 includes a first or upper branch 102-1 and a second or lower branch 102-2. The first branch 102-1 includes an input section 104-1, a first absorption-controlled section 106-1, a refraction-controlled section 108-1, a second absorption-controlled section 110-1 and an output section 112-1. The second branch 102-2 includes an input section 104-2, a first absorption-controlled section 106-2, a refraction-controlled section 108-2, a second absorption-controlled section 110-2 and an output section 112-2. The absorption-controlled and refraction-controlled sections of switch 100 may be configured in a manner similar to that described above for corresponding sections of the 1×2 Y-branch switch 10 of FIG. 1. The switch 100 is configured in a mode of operation in which an input optical signal applied to input section 104-1 of the first branch 102-1 is coupled via the refraction-controlled sections 108-1 and 108-2 to the output section 112-2 of the second branch 102-2 as indicated by the solid horizontal arrows. This mode of operation is provided by placing the refraction-controlled section 108-2 in an on state while the refraction-controlled section 108-1 and the absorption-controlled sections 106-1, 106-2 and 110-2 are placed in an off state. Reduced crosstalk is provided in accordance with the present invention by placing the absorption-controlled section 10-1 of the non-selected branch 102-1 into an on state. The switch 100 may also be used as a basic building block to construct larger N×N switch arrays.

The present invention provides refraction-controlled and absorption-controlled digital optical switches which exhibit substantially reduced crosstalk without the significant increases in switch size, insertion loss and control complexity associated with conventional switch dilation techniques. Modal interference induced crosstalk is suppressed in the switch by providing appropriate loss, gain and/or refractive index changes in different parts of the switch structure. The invention may be implemented in a 1×2 Y-branch switch, a 2×2 directional coupler switch, or in a variety of other implementations. The basic switches configured in accordance with the invention may be used to construct larger 1×N, N×1, N×M and N×N switch arrays, thereby providing improved crosstalk performance in wavelength division multiplexed optical systems as well as other optical signal processing applications.

The above-described embodiments of the invention are intended to be illustrative only. Numerous alternative embodiments may be devised by those skilled in the art without departing from the scope of the following claims.

What is claimed is:

1. A method of reducing crosstalk in an optical switch having a first branch and a second branch, each of the first and second branches including a refraction-controlled section and an absorption-controlled section, the method including the steps of:

selecting one of the first and second branches as part of a desired optical signal path through the switch, such that one of the first and second branches is a selected branch and the other is a non-selected branch;

configuring the absorption-controlled section of the selected branch into a first absorption state providing a first level of absorption and no substantial gain for the optical signal; and configuring the absorption-controlled section of the non-selected branch into an second absorption state providing a second level of absorption greater than the first level of absorption.

2. The method of claim 1 wherein the optical switch operates as a Y-branch switch.

3. The method of claim 1 wherein the optical switch operates as a directional coupler, and the first and second branches each include first and second absorption-controlled sections.

4. The method of claim 3 wherein the step of configuring the absorption-controlled section of the selected branch into a first absorption state providing a first level of absorption further includes the step of configuring both the first and second absorption-controlled sections of the selected branch into the first absorption state.

5. The method of claim 3 wherein the step of configuring the absorption-controlled section of the non-selected branch into a second absorption state providing a second level of absorption greater than the first level of absorption further includes the step of configuring one of the first and second absorption-controlled sections in the non-selected branch into the first absorption state and the other absorption-controlled section in the non-selected branch into the second absorption state.

6. The method of claim 1 wherein the steps of configuring the absorption-controlled sections further include the step of configuring at least one of the absorption-controlled sections using a gain switching technique.

7. The method of claim 6 wherein the step of configuring at least one of the absorption-controlled sections using a gain switching technique further includes the step of injecting current into a forward-biased diode structure corresponding to the absorption-controlled section.

8. The method of claim 1 wherein the steps of configuring the absorption-controlled sections further include the step of configuring at least one of the absorption-controlled sections using an electro-absorptive technique which involves reverse biasing a diode structure corresponding to the absorption-controlled section.

9. The method of claim 1 further including the step of configuring the refraction-controlled sections of the selected branch and the non-selected branch into a state which allows an optical signal to propagate through at least a portion of the selected branch, wherein at least one of the refraction-controlled sections a configured using carrier-induced effects.

10. The method of claim 9 wherein the step of configuring at least one of the refraction-controlled sections using carrier-induced effects further includes the step of injecting carriers into a forward-biased diode structure corresponding to the refraction-controlled section.

11. The method of claim 9 wherein the step of configuring at least one of the refraction-controlled sections using carrier-induced effects further includes the step of depleting carriers from a reverse-biased diode structure corresponding to the refraction-controlled section.

12. The method of claim 1 wherein the step of configuring the refraction-controlled sections of the selected branch and the non-selected branch into a state which allows an optical signal to propagate further includes the step of configuring at least one of the refraction-controlled sections using an electro-refractive technique which involves reverse biasing a diode structure corresponding to the refraction-controlled section.

13. The method of claim 1 wherein the step of configuring the absorption-controlled section of the selected branch into a first absorption state providing a first level of absorption and no substantial gain for the optical signal further includes configuring the absorption-controlled section of the selected branch such that it is effectively transparent at the optical signal wavelength.

14. An optical switch comprising:

first and second branches each having a refraction-controlled section and an absorption-controlled section; and an optical signal path over which an optical signal propagates in passing through the switch, the optical signal path including a portion of at least one of the first and second branches, such that one of the first and second branches is a selected branch and the other branch is a non-selected branch, wherein the absorption-controlled section of the selected branch is configured in a first absorption state providing a first level of absorption and no substantial gain for the optical signal, and the absorption-controlled section of the non-selected branch is configured in a second absorption state providing a second level of absorption greater than the first level of absorption.

15. The apparatus of claim 14 wherein the optical switch operates as a Y-branch switch.

16. The apparatus of claim 14 wherein the optical switch operates as a directional coupler, and the first and second branches each include first and second absorption-controlled sections.

17. The apparatus of claim 16 wherein both the first and second absorption-controlled sections of the selected branch are configured in the first absorption state.

18. The apparatus of claim 16 wherein one of the first and second absorption-controlled sections in the non-selected branch is configured in the first absorption state and the other absorption-controlled section in the non-selected branch is configured in the second absorption state.

19. The apparatus of claim 14 wherein at least one of the absorption-controlled sections is configured using a gain switching technique.

20. The apparatus of claim 19 wherein at least one of the absorption-controlled sections is configured using a gain switching technique by injecting current into a forward-biased diode structure corresponding to the absorption-controlled section.

21. The apparatus of claim 14 wherein at least one of the absorption-controlled sections is configured using an electro-absorptive technique which involves reverse biasing a diode structure corresponding to the absorption-controlled section.

22. The apparatus of claim 14 wherein at least one of the refraction-controlled sections is configured using carrier-induced effects.

23. The apparatus of claim 22 wherein the carrier-induced effects include injecting carriers into a forward-biased diode structure corresponding to the refraction-controlled section.

24. The apparatus of claim 22 wherein the carrier-induced effects include depleting carriers from a reverse-biased diode structure corresponding to the refraction-controlled section.

25. The apparatus of claim 14 wherein at least one of the refraction-controlled sections is configured using an electro-refractive technique which involves reverse biasing a diode structure corresponding to the refraction-controlled section.

26. The apparatus of claim 14 wherein the absorption-controlled section of the selected branch such that it is effectively transparent at the optical signal wavelength.

27. An optical switch comprising:
- a region of refraction-control material formed on a substrate;
- a region of absorption-control material formed on the substrate adjacent to the region of refraction-control material; and
- first and second switch branches, each having a refraction-controlled section associated with the refraction-control material region and an absorption-controlled section associated with the absorption-control material region, such that in configuring a given optical path through at least a portion of the switch, one of the first and second branches is configured as a selected branch and the other branch as a non-selected branch, wherein the absorption-controlled section of the selected branch is configured to provide a first level of absorption and no substantial gain for the optical signal, and the absorption-controlled section of the non-selected branch is configured to provide a second level of absorption greater than the first level of absorption.

28. The apparatus of claim 27 wherein the refraction-controlled and absorption-controlled sections are formed as ridge waveguide structures overlying the respective refraction-control and absorption-control material regions.

29. The apparatus of claim 27 wherein the refraction-controlled and absorption-controlled sections are formed as waveguide structures which are at least partially buried in an underlying region.

30. The apparatus of claim 27 wherein the refraction-controlled section of the selected branch is configured in a state providing a first effective refractive index which allows an optical signal to propagate along at least a portion of the selected branch, and the refraction-controlled section of the non-selected branch is configured in a state providing a second effective refractive index lower than the first effective refractive index.

31. The apparatus of claim 27 wherein at least one of the absorption-controlled sections is configured using a gain switching technique by injecting current into a forward-biased diode structure corresponding to the absorption-controlled section.

32. The apparatus of claim 27 wherein at least one of the absorption-controlled sections is configured using an electro-absorptive technique which involves reverse biasing a diode structure corresponding to the absorption-controlled section.

33. The apparatus of claim 27 wherein at least one of the refraction-controlled sections is configured using carrier-induced effects.

34. The apparatus of claim 33 wherein the carrier-induced effects include injecting carriers into a forward-biased diode structure corresponding to the refraction-controlled section.

35. The apparatus of claim 33 wherein the carrier-induced effects include depleting carriers from a reverse-biased diode structure corresponding to the refraction-controlled section.

36. The apparatus of claim 27 wherein at least one of the refraction-controlled sections is configured using an electro-refractive technique which involves reverse biasing a diode structure corresponding to the refraction-controlled section.

37. The apparatus of claim 27 wherein the absorption-controlled section of the selected branch is configured so as to be effectively transparent at the optical signal wavelength.

38. An optical switch array comprising:
- a plurality of optical switches, at least a subset of the optical switches each having first and second branches, with each of the first and second branches having a refraction-controlled section and an absorption-controlled section; and
- an optical signal path over which an optical signal propagates in passing through at least a portion of the switch array, the optical signal path including a portion of at least one of the first and second branches of a given switch, such that one of the first and second branches of the given switch is a selected branch and the other branch is a non-selected branch, wherein the absorption-controlled section of the selected branch is configured in a first absorption state providing a first level of absorption and no substantial gain for the optical signal, and the absorption-controlled section of the non-selected branch is configured in a second absorption state providing a second level of absorption greater than the first level of absorption.

39. The apparatus of claim 38 wherein the refraction-controlled and absorption-controlled sections of the plurality of optical switches in the switch array are configured to provide a routing function for the optical signal.

40. The apparatus of claim 38 wherein the refraction-controlled and absorption-controlled sections of the plurality of optical switches in the switch array are configured to provide a broadcasting function for the optical signal.

41. The apparatus of claim 38 wherein the refraction-controlled and absorption-controlled sections of the plurality of optical switches in the switch array are configured to provide a no-connection function for the optical signal.

42. The apparatus of claim 38 wherein the absorption-controlled section of the selected branch is configured so as to be effectively transparent at the optical signal wavelength.

43. A method of reducing crosstalk in an optical switch having a first branch and a second branch, each of the first and second branches including a refraction-controlled section and an absorption-controlled section, the method including the steps of:
- selecting one of the first and second branches as part of a desired optical signal path through the switch, such that one of the first and second branches is a selected branch and the other is a non-selected branch;
- configuring the absorption-controlled section of the selected branch into a first absorption state providing a first level of absorption; and
- configuring the absorption-controlled section of the non-selected branch into an second absorption state providing a second level of absorption greater than the first level of absorption, wherein at least one of the absorption-controlled sections of the selected and non-selected branches operates using an electro-absorptive technique.

44. An optical switch comprising:
- first and second branches each having a refraction-controlled section and an absorption-controlled section; and
- an optical signal path over which an optical signal propagates in passing through the switch, the optical signal path including a portion of at least one of the first and second branches, such that one of the first and second branches is a selected branch and the other branch is a non-selected branch, wherein the absorption-controlled section of the selected branch is configured in a first absorption state providing a first level of absorption, and the absorption-controlled section of the non-selected branch is configured in a second absorption state providing a second level of absorption greater than the first level of absorption, and further wherein at least one of the absorption-controlled sections of the selected and non-selected branches operates using an electro-absorptive technique.

45. An optical switch comprising:

a region of refraction-control material formed on a substrate;

a region of absorption-control material formed on the substrate adjacent to the region of refraction-control material; and first and second switch branches, each having a refraction-controlled section associated with the refraction-control material region and an absorption-controlled section associated with the absorption-control material region, such that in configuring a given optical path through at least a portion of the switch, one of the first and second branches is configured as a selected branch and the other branch as a non-selected branch, wherein the absorption-controlled section of the selected branch is configured to provide a first level of absorption, and the absorption-controlled section of the non-selected branch is configured to provide a second level of absorption greater than the first level of absorption, and further wherein at least one of the absorption-controlled sections of the selected and non-selected branches operates using an electro-absorptive technique.

46. An optical switch array comprising:

a plurality of optical switches, at least a subset of the optical switches each having first and second branches, with each of the first and second branches having a refraction-controlled section and an absorption-controlled section; and an optical signal path over which an optical signal propagates in passing through at least a portion of the switch array, the optical signal path including a portion of at least one of the first and second branches of a given switch, such that one of the first and second branches of the given switch is a selected branch and the other branch is a non-selected branch, wherein the absorption-controlled section of the selected branch is configured in a first absorption state providing a first level of absorption, and the absorption-controlled section of the non-selected branch is configured in a second absorption state providing a second level of absorption greater than the first level of absorption, and further wherein at least one of the absorption-controlled sections of the selected and non-selected branches operates using an electro-absorptive technique.

* * * * *

UNITED STATES PATENT AND TRADEMARK OFFICE
CERTIFICATE OF CORRECTION

PATENT NO. : 5,889,898
DATED : March 30, 1999
INVENTOR(S) : Uziel Koren, Anat Sneh, Jane Elisa Zucker It is certified that error appears in the above-identified patent and that said Letters Patent is hereby corrected as shown below:

Column 1,
Line 2, after the Title insert
-- ACKNOWLEDGEMENT OF GOVERNMENTAL RIGHTS This invention was made with Government support under Agreement No. MDA 972-94-3-0036 awarded by ARPA. The Government has certain rights in the invention. --

Signed and Sealed this

Twenty-seventh Day of November, 2001

*Attest:*

*Nicholas P. Godici*

*Attesting Officer*

NICHOLAS P. GODICI
*Acting Director of the United States Patent and Trademark Office*